(12) United States Patent
Chien et al.

(10) Patent No.: US 7,016,165 B2
(45) Date of Patent: Mar. 21, 2006

(54) ABUTTED JUNCTION GMR READ HEAD WITH AN IMPROVED HARD BIAS LAYER AND A METHOD FOR ITS FABRICATION

(75) Inventors: Chen-Jung Chien, Milpitas, CA (US); Chyu-Jiuh Torng, Pleasanton, CA (US); Cherng-Chyi Han, San Jose, CA (US); Cheng T. Horng, San Jose, CA (US); Mao-Min Chen, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 644 days.

(21) Appl. No.: 09/822,491

(22) Filed: Apr. 2, 2001

(65) Prior Publication Data

US 2002/0181171 A1  Dec. 5, 2002

(51) Int. Cl.
*G11B 5/127* (2006.01)
(52) U.S. Cl. .................................. 360/324.12
(58) Field of Classification Search .......... 360/324.12
See application file for complete search history.

(56) References Cited

U.S. PATENT DOCUMENTS

| | | | |
|---|---|---|---|
| 5,434,826 A * | 7/1995 | Ravipati et al. | 367/140 |
| 5,646,805 A | 7/1997 | Shen et al. | 360/113 |
| 5,739,987 A | 4/1998 | Yuan et al. | 360/113 |
| 5,739,990 A | 4/1998 | Ravipati et al. | 360/113 |
| 5,742,459 A * | 4/1998 | Shen et al. | 360/327.32 |
| 5,759,681 A | 6/1998 | Hosoe et al. | 428/332 |
| 6,018,443 A | 1/2000 | Watanabe et al. | 360/113 |
| 6,046,892 A | 4/2000 | Aoshima et al. | 360/113 |

OTHER PUBLICATIONS

E.W. Singleton et al., "Effects of Cr, Cr V, and CrTi Underlayers on Magnetic Structural, and Materials Reliability Properties of Copt Thin Films", Jrnl of Applied Physics, vol. 85, No. 8, Apr. 15, 1999, pp. 5840-5842.

N. Inaba et al., Magnetic and Crystallographic Properties of CoGpt Thin Films Formed Cruti Single Crystalline Underlayers, Jrnl of Applied Physics, vol. 79, No. 8, Apr. 15, 1996, pp. 5354-5356.

* cited by examiner

*Primary Examiner*—David D. Davis
(74) *Attorney, Agent, or Firm*—George D. Saile; Stephen B. Ackerman

(57) ABSTRACT

A method for forming a spin-valve type abutted junction GMR sensor element with a thinner hard magnetic longitudinal bias layer having significantly improved magnetic properties in the junction region and a spin-valve type abutted junction GMR sensor element with a thinner hard magnetic longitudinal bias layer having significantly improved magnetic properties in the junction region fabricated according to that method.

14 Claims, 1 Drawing Sheet

ABUTTED JUNCTION GMR READ HEAD WITH AN IMPROVED HARD BIAS LAYER AND A METHOD FOR ITS FABRICATION

BACKGROUND OF THE INVENTION

1. Field of the Invention

This invention relates generally to the fabrication of a giant magnetoresistive (GMR) magnetic field sensor for a magnetic read head, more specifically to the formation of magnetic bias layers on an abutted junction.

2. Description of the Related Art

Magnetic read heads whose sensors make use of the giant magnetoresistive effect (GMR) in the spin-valve configuration (SVMR) base their operation on the fact that magnetic fields produced by data stored in the medium being read cause the direction of the magnetization of one layer in the sensor (the free magnetic layer) to move relative to a fixed magnetization direction of another layer of the sensor (the fixed or pinned magnetic layer). Because the resistance of the sensor element is proportional to the cosine of the (varying) angle between these two magnetizations, a constant current (the sensing current) passing through the sensor produces a varying voltage across the sensor which is interpreted by associated electronic circuitry. The accuracy, linearity and stability required of a GMR sensor places stringent requirements on the magnetization of its fixed and free magnetic layers. The fixed layer, for example, has its magnetization "pinned" in a direction normal to the air bearing surface of the sensor (the transverse direction) by an adjacent magnetic layer called the pinning layer. The free layer is magnetized in a direction along the width of the sensor and parallel to the air bearing surface (the longitudinal direction). Layers of hard magnetic material (permanent magnetic layers) or laminates of antiferromagnetic and soft magnetic materials are typically formed on each side of the sensor and oriented so that their magnetic field extends in the same direction as that of the free layer. These layers, called longitudinal bias layers, maintain the free layer as a single magnetic domain and also assist in linearizing the sensor response by keeping the free layer magnetization direction normal to that of the fixed layer when quiescent. Maintaining the free layer in a single domain state significantly reduces noise (Barkhausen noise) in the signal produced by thermodynamic variations in domain configurations. Longitudinal bias is also needed to maintain single domain structure in forms of magnetoresistive sensors that make use of the anisotropic magnetoresistive (AMR) effect, wherein the resistance of the sensor is a function of the angle between the magnetization of a single magnetic layer and the direction of the current in that layer. Indeed, it has also been demonstrated that longitudinal bias is useful in maintaining single domain structure in the magnetic shield layers that surround read heads and protect them from extraneous fields.

The importance of longitudinal bias has led to various inventions designed to improve the material composition, structure, positioning and method of forming the magnetic layers that produce it. As a result of these developments, the present art provides for sensor structures in which the longitudinal bias layers abut the ends of the active region of the sensor, fixing the domain structure of the free magnetic layer by some form of magnetic interaction. In addition, it has become accepted practice in the present art to channel the sensing current into and out of the sensor element by means of conducting lead layers formed directly over the magnetic bias layers. The status and scope of the present art can be inferred from a brief description of the following patents which are listed in chronological order.

Shen, et al. (U.S. Pat. No. 5,646,805) teaches the formation of an AMR sensor whose end portions partially abut longitudinal bias layers formed of hard magnetic materials whose composition is not specifically noted. The transverse bias for the sensor is supplied by a soft magnetic adjacent layer (SAL) separated from the magnetoresistive layer by a spacer layer. The SAL is magnetized by the sensor current which is fed into the sensor by conductive leads formed over the hard magnetic bias layers.

Yuan et al. (U.S. Pat. No. 5,739,987) teach the formation of an abutted junction type AMR sensor in which longitudinal bias is provided by a multilayer formation of alternating soft ferromagnetic (FM) and antiferromagnetic (AF) films. In contrast to hard magnetic biasing layers, this multilayer formation is effectively inactive magnetically and achieves its biasing by exchange coupling with the magnetoresistive layer of the sensor.

Ravipati et al. (U.S. Pat. No. 5,739,990) teach the formation of a GMR type sensor in which the longitudinal bias is provided by either a hard magnetic layer of CoCrPt or CoCrTaPt, or various forms of conductive or non-conductive antiferromagnetic materials. In accordance with the method, conductive leads are formed over the bias layer in a manner that directs the current along a different path than the path taken by the magnetic bias fields.

Shen et al. (U.S. Pat. No. 5,742,459) teach the formation of an encapsulated AMR sensor in which a layer of refractory material surrounds the magnetoresistive portion of the sensor and protects it from diffusion and electromigration from the bias layers and conductive lead layers on either side. The encapsulation layer can be formed of tantalum, niobium or alloys of tantalum tungsten, niobium tungsten, niobium tantalum, molybdenum niobium, molybdenum tungsten, molybdenum tantalum, chromium molybdenum, chromium tungsten, tantalum rhenium or any of a group of numerous other complex carbides and nitrides. The material composition of the bias layer is not specified.

Hosoe et al. (U.S. Pat. No. 5,759,681) teach the formation of an entire recording system, which includes a magnetic disk of novel material structure and a read/write head designed to read and write on said disk. The read head fabricated to accompany the system is not of the abutted junction form and it utilizes an antiferromagnetic domain control layer and a NiFeNb soft magnetic bias layer.

Watanabe et al. (U.S. Pat. No. 6,018,443) teach the use of hard magnetic bias layers for maintaining single domain structures in both the shields and the magnetoresistive layers of a GMR read head. The hard films are formed on either side of the upper and lower shields and the leakage magnetic field of said hard layers orients the magnetization of the shields along their easy axis. This effect eliminates anisotropic dispersion (caused by domain breakup) in the shields and also eliminates the hysteresis of the head as a whole while correspondingly reducing the coercive force. Although the magnetoresistive element is also longitudinally biased in the same manner and with the same hard magnetic material as the shields, it is the biasing of the shields that provides the novelty of the method of Watanabe. In accordance with the method, the hard layers are composed of material selected from the group consisting of a CoPt alloy, a CoPtCr alloy and a CoCrTa alloy, providing a coercive force, $H_c$, of not less than 500 Oe.

Aoshima et al. (U.S. Pat. No. 6,046,892) teach the formation of a GMR read element having an underlayer that reduces current loss. Since the output of a GMR read head element is proportional to the amount of sensing current passing through it, a structure that reduces current loss in the sensor will correspondingly have an improved sensitivity. The antiferromagnetic pinning layer and the NiFe underlayer found in many GMR sensors do not directly contribute to the GMR effect, but do contribute to current loss. Therefore, according to the method of Aoshima, an underlayer composed of Ni and NiFe alloy and at least one additive selected from the group consisting of Cr, Nb, Rh and Pd will reduce the current loss. In another embodiment of the method, the underlayer is composed of NiFeCr alloy formed on a Ta sublayer. Also in accord with the method, the hard magnetic longitudinal bias layer is composed of CoCrPt.

The formation of the hard bias layer is most advantageous if it can be made as thin as possible. Since it is common practice to form conductive leads for the sensing current over the bias layer, the thickness of the bias layer raises the height of the leads and correspondingly increases the overall height of the GMR element. As magnetic media are recorded at increasingly greater area densities, it is advantageous to minimize both the height and width of the GMR sensor element. The width of the sensor element, which defines the usable track width of the read head, is determined by the distance between the abutted junctions, which are formed by etching back the GMR fabrication. The height of the sensor element is determined by the distance between the magnetic shields that are formed above and below it. Since the conducting leads are formed over the bias layer, a thick bias layer will increase the distance between shields. If the shields are then brought down too close to the conducting leads in an attempt to minimize thickness, the possibility of electrical shorting between the leads and the shields becomes a problem. It is clear that an effective solution to the thickness problem is to minimize the thickness of the bias layer, while still maintaining sufficient magnetization to achieve its desired effects.

The width of the active portion of the sensor is also advantageously made as small as possible. This is typically achieved by making the abutted junction profile sharp and the sides of the junction close to vertical. A disadvantage of this geometry is the fact that the sensor stability is then most seriously affected by the properties of the bias layer at the position of junction itself, particularly at the tail of the seed layer upon which the magnetic layers of the sensor element are formed. Our experiments have demonstrated that the coercivity of the bias layer, $H_c$, the magnetic moment of the bias layer and the squareness of the bias layer, Sq (the ratio of its remanent moment to its saturation moment), are extremely sensitive to its material properties and to lattice matching between the bias layer and the seed and magnetic layers of the sensor at the junction between the sensor and the bias layer.

The prior art of forming longitudinal bias layers, as evidenced by the patents cited above, does not adequately take into consideration the properties of the bias layer at the junction and the importance of achieving proper material matching thereat. Although it has been reported that the properties of magnetic layers can be improved when they are formed on appropriate underlayers ("Effects of Cr, CrV, and CrTi underlayers on magnetic, structural and materials reliability properties of CoPt thin films," E. W. Singleton, P. B. Narayan, Wei Xiong, Ramas Raman and Hung-Lee Hoo, J. Appl Phys., Vol. 85, No. 8, Apr. 15, 1999, p. 5840, and "Magnetic and crystallographic properties of CoCrPt thin films formed on Cr—Ti single crystalline underlayers," N. Inaba, A. Nakamura, T. Yamamoto, Y. Hosoe and M. Futamoto, J. Appl. Phys., Vol 79, No. 8, Apr. 15, 1996, p. 5354), the prior art disclosed above does not take into consideration the fact that the use of proper sublayers will screen out structural distortions and the proper matching of the material properties of the bias layer to the seed and sensor layers of the GMR element at the junction surface and particularly at the tail of the seed layer, will both allow the formation of a thinner bias layer, thus addressing the shorting problem, and improve the sensitivity and stability of the sensor.

SUMMARY OF THE INVENTION

A first object of this invention is to provide a method for forming a hard (permanent) magnetic longitudinal bias layer for a spin-valve type abutted junction GMR sensor element which will produce a longitudinal bias layer with dramatically improved coercivity and squareness in the region of the abutted junction.

A second object of this invention into provide a method for forming a thinner hard magnetic bias layer, having the same magnetic moment as thicker bias layers of the prior art, for a spin-valve type abutted junction GMR sensor element, thus alleviating problems of electrical shorting between the sensor and the surrounding shields.

A third object of this invention is to provide a method for forming a hard magnetic bias layer with the properties cited above which also will not affect the formation of effective conducting lead layers upon it.

In accord with the objects of this invention there is provided a spin-valve type abutted junction GMR sensor element with a thinner hard longitudinal bias layer having improved hard bias properties in the region of the abutted junction, and a method for its fabrication. The hard bias layer so provided is a material layer composed of CoY, where Y can be any member of the group consisting of CrNi, CrPt, Pt or CrTa alloy, said hard bias layer being formed over a seed layer composed of Cr, CrX or Ta/CrX alloy, where X can be any member of the group consisting of Ti, W, Mo, V or Mn.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying figures, wherein.

DESCRIPTION OF THE PREFERRED EMBODIMENT

Figure 1:
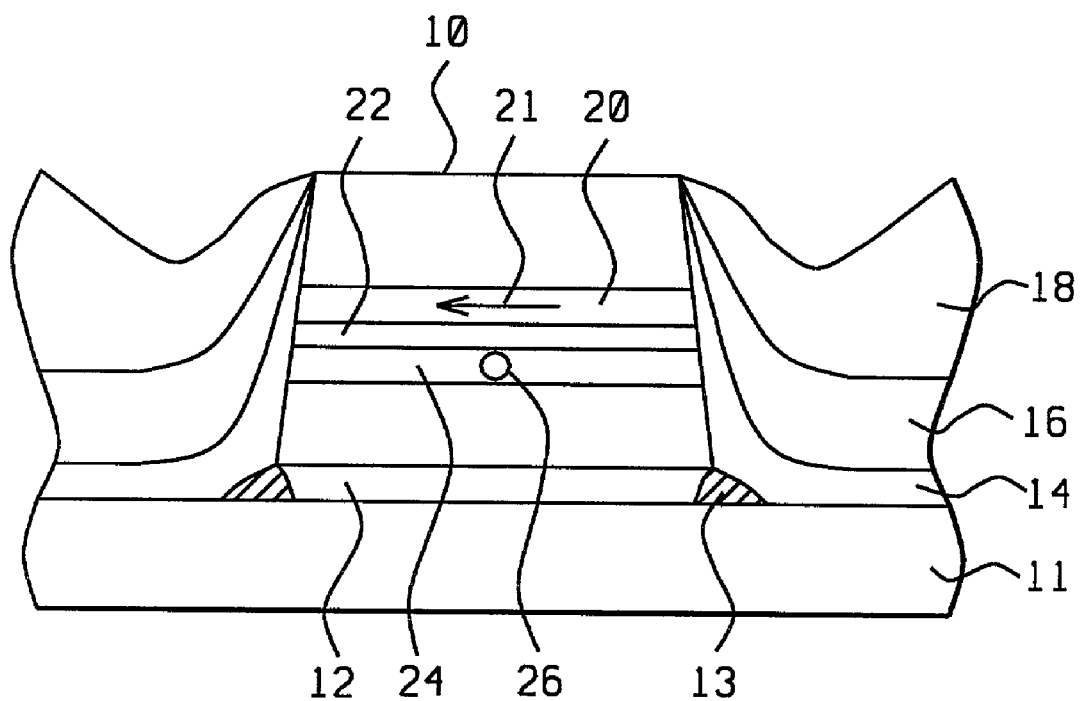
FIG. 1 is a schematic diagram of an abutted junction GMR sensor stack having a seed layer, a hard bias layer and a conducting lead layer fabricated on said abutted junction according to the method of the present invention. With the exception of its seed layer, free and pinned magnetic layers, most details of the sensor stack are omitted, since the stack comprises a typical spin valve type GMR sensor whose structure is well known to practitioners of the art

The present invention is a spin-valve type abutted junction GMR sensor element with a thinner hard magnetic longitudinal bias layer having significantly improved magnetic properties in the junction region. The fabrication of said GMR sensor element in accord with the preferred embodiment of the present invention is to be understood in the context of FIG. 1 and the description provided below.

Referring to FIG. 1, there is shown an abutted junction spin-valve type GMR sensor element fabricated in accordance with the methods of this invention. It comprises a spin-valve GMR sensor stack (10), upon whose abutted junction is formed a seed layer (14), composed of Cr, CrX or Ta/CrX alloy, where X can be any member of the group consisting of Ti, W, Mo, V or Mn. Said CrX seed layer is formed to a thickness of between 15 Angstroms and 200 Angstroms, whereas said Ta underlayer, upon which may be formed the CrX seed layer, is formed to a thickness of between 10 Angstroms and 200 Angstroms. Upon the seed layer (14) there is formed a bias layer (16) of hard (permanent) magnetic material whose purpose is to provide longitudinal bias for the free ferromagnetic layer (20) of the sensor element. Said bias layer is composed of CoY, where Y can be any member of the group consisting of CrNi, CrPt, Pt or CrTa alloy and is formed to a thickness of between 50 Angstroms and 1000 Angstroms. Upon said bias layer (16), there is formed a conducting lead layer (18) to carry the sensor current. The conducting lead layer may be formed of any of several materials known to practitioners of the art, such as Ta, Mo, Mo/Au/Mo, Cu, or W, and may be formed by any of several methods, but in the present embodiment it comprises a layer of Ta/Au/Ta, deposited to a thickness of between 100 Angstroms and 1650 Angstroms by a method of ion-beam sputtering.

The GMR spin-valve type sensor element (10) is fabricated upon a substrate (11) of $Al_2O_3$, upon which is formed an underlying seed layer (12), whose material composition may be Ta/NiCr, Ta/NiFeCr, NiCr, NiFeCr or Ta. The detailed structure of the sensor element is not shown, save for a schematic indication of its free ferromagnetic layer (20), showing its longitudinally directed magnetic moment (21), a non-magnetic spacer layer (22) and a pinned ferromagnetic layer (24), having a transversely directed magnetic moment (26). Particular attention is drawn to the tail (13) of the seed layer, which is shaded in the figure for emphasis. The tail is a result of the etching process (an ion etch) that produces the abutted junction. If a hard magnetic bias layer were formed directly over the tail, whereby the intervening CrX or Ta/CrX layer (14) of the present invention would be absent and which would not be in accord with the method of the present invention, the tail (13) would produce a lattice mismatch with the hard magnetic bias layer (16) and adversely affect its magnetic properties.

The choice of materials and thicknesses for the seed layer (14) and hard bias layer (16) was determined by a series of empirical investigations, as a result of which it was established that a hard bias layer composed of CoY, with Y being chosen from the group consisting of CrPt, Pt or CrTa alloy, deposited, as noted above, on a seed layer consisting of either Cr, CrX or Ta/CrX alloy, where X can be any member of the group consisting of Ti, W, Mo, V or Mn, will dramatically enhance the coercivity, $H_c$, by at least 20% and squareness, Sq, ("squareness" being the ratio of remanent moment to saturation moment, $M_r/M_s$, an indicator of flux linkage between the bias layer and the GMR free layer) of the hard bias layer by 6%, near the junction area of a NiCr-based, NiFeCr-based or Ta-based GMR sensor, while retaining the same total magnetic moment, $M_r t$ (product of the remanent moment $M_r$, and the layer thickness, t), as the thicker bias layers of the prior art.

Table 1.1, below, lists the results of experiments carried out on three samples, each of which had in common a GMR stack with a NiCr seed layer, an abutted junction and a hard bias layer consisting of a layer of CoCrPt. The samples differed in the material of the seed layer on which the hard bias layer was formed; sample 1 having a Cr seed layer, sample 2 having a Ta/Cr seed layer (ie a Cr layer formed over a Ta layer) and sample 3 having a Ta/CrTi seed layer. As the table shows, the configuration of sample 3, which corresponds to a configuration of a preferred embodiment, has a substantially increased coercivity and squareness as compared to the other two samples. We conclude from these results that the Ta sublayer beneath the CrTi seed layer in sample 3 has screened out the structure distortion produced by the NiCr seed layer of the GMR stack, while the CrTi improves the lattice matching to the CoCrPt hard bias layer formed upon it.

TABLE 1.1

|  | Structure | $H_c$ (Oe) | Sq. |
| --- | --- | --- | --- |
| Sample 1 | NiCr/Cr/CoCrPt | 650 | 0.42 |
| Sample 2 | NiCr/Ta/Cr/CoCrPt | 1100 | 0.7 |
| Sample 3 | NiCr/Ta/CrTi/CoCrPt | 1700 | 0.9 |

Table 1.2, below, assesses the physical properties of samples 4 and 5, which are identical in material composition to samples 2 and 3 in table 1.1 and also abut a GMR stack with a NiCr seed layer, but the experiment now focuses on the decrease in the CoCrPt hard bias layer thickness, t, made possible by the CrTi seed layer, for a total magnetization, $M_r t$ (product of remanent moment and thickness), typical of the prior art,. As can be seen, the CrTi seed layer permits the thickness to be reduced by 100 Angstroms, a significant factor in the fabrication of increasingly thinner read sensors.

TABLE 1.2

|  | Structure | Bias thickness t (Angstroms) | $M_r t$ (memu/cm$^2$) |
| --- | --- | --- | --- |
| Sample 4 | NiCr/Ta/Cr/CoCrPt | 450 | 2.6 |
| Sample 5 | NiCr/Ta/CrTi/CoCrPt | 350 | 2.6 |

Tables 2.1 and 2.2, below, differ from the previous tables only in the fact that the GMR stack now has a Ta seed layer rather than an NiCr seed layer. CrTi/CoCrPt is the (seed layer/hard bias layer) structure outside the abutted junction, while Ta/CrTi/CoCrPt is the structure near the junction, the Ta originating in the GMR stack seed layer.

TABLE 2.1

|  | Structure | $H_c$ (Oe) | Sq. |
| --- | --- | --- | --- |
| Sample 6 | Cr/CoCrPt | 1600 | 0.85 |
| Sample 7 | Ta/Cr/CoCrPt | 1250 | 0.84 |
| Sample 8 | CrTi/CoCrPt | 1900 | 0.9 |
| Sample 9 | Ta/CrTi/CoCrPt | 1600 | 0.89 |

TABLE 2.2

|  | Structure | Hard bias thickness (Angstroms) | $M_r t$ |
| --- | --- | --- | --- |
| Sample 10 | Cr/CoCrPt | 450 | 3.1 |
| Sample 11 | CrTi/CoCrPt | 400 | 3.1 |

As is understood by a person skilled in the art, the preferred embodiment of the present invention is illustrative of the present invention rather than limiting of the present invention. Revisions and modifications may be made to methods, materials, structures and dimensions employed in fabricating a spin-valve type abutted junction GMR sensor element with a thinner hard magnetic longitudinal bias layer having significantly improved magnetic properties in the junction region, while still providing a method for fabricating such a spin-valve type abutted junction GMR sensor element with a thinner hard magnetic longitudinal bias layer having significantly improved magnetic properties in the junction region, in accord with the spirit and scope of the present invention as defined by the appended claims.

What is claimed is:

1. A method for forming a spin-valve type abutted junction GMR sensor element with a thinner hard magnetic longitudinal bias layer having significantly improved magnetic properties in the junction region comprising:

provided a substrate;

forming over said substrate a first seed layer for said spin-valve GMR sensor element;

forming over said first seed layer said spin-valve GMR sensor element;

etching said spin-valve GMR sensor element and said first seed layer to produce surfaces for abutted junctions, said surfaces including substantially vertical lateral edge surfaces on said sensor element and horizontal projections on said first seed layer;

forming over said surfaces for abutted junctions a lattice matching second seed layer for said hard magnetic longitudinal bias layer, said second seed layer covering all of said surfaces;

forming over said lattice matching seed layer said hard magnetic longitudinal bias layer, an undersurface of said bias layer contacting only the second seed layer;

forming over said hard magnetic longitudinal bias layer a conducting lead layer.

2. The method of claim 1 wherein the first seed layer for the spin-valve GMR sensor element is a layer of material chosen from the group consisting of NiCr and NiFeCr, and is formed to a thickness of between 15 Angstroms and 200 Angstroms.

3. The method of claim 1 wherein the first seed layer for the spin-valve GMR sensor element is a layer of Ta, and is formed to a thickness of between 15 Angstroms and 200 Angstroms.

4. The method of claim 2 wherein the lattice matching second seed layer for the hard magnetic longitudinal bias layer comprises a layer of CrX, X being chosen from the group consisting of Ti, W, Mo, V, and Mn, formed on a Ta underlayer, the Ta being formed to a thickness of between 10 Angstroms and 200 Angstroms, and the CrX being formed to a thickness of between 15 Angstroms and 200 Angstroms.

5. The method of claim 3 wherein the lattice matching second seed layer for the hard magnetic longitudinal bias layer is a layer of CrX, X being chosen from the group consisting of Ti, W, Mo, V, and Mn and the CrX being formed to a thickness of between 15 Angstroms and 200 Angstroms.

6. The method of claim 1 wherein the hard magnetic longitudinal bias layer is a layer of CoY, wherein Y is chosen from the group consisting of CrPt, Pt, and CrTa alloy, and is formed to a thickness of between 50 Angstroms and 1000 Angstroms.

7. The method of claim 1 wherein the conducting lead layer is a layer of Ta/Au/Ta and is formed to a thickness of between 100 Angstroms and 1650 Angstroms.

8. A spin-valve type abutted junction GMR sensor element with a thinner hard magnetic longitudinal bias layer having significantly improved magnetic properties in the junction region comprising:

a substrate;

a first seed layer for said spin-valve GMR sensor element formed over said substrate;

said spin-valve GMR sensor element formed over said first seed layer;

surfaces for abutted junctions etched into said spin-valve GMR sensor element and said first seed layer, said surfaces including substantially vertical lateral edge surfaces on said sensor element and horizontal projections on said first seed layer;

a lattice matching second seed layer for said hard magnetic longitudinal bias layer formed over said surfaces for abutted junctions, said second seed layer completely covering said surfaces;

said hard magnetic longitudinal bias layer formed over said lattice matching second seed layer, an undersurface of said bias layer contacting only said second seed layer;

a conducting lead layer formed over said hard magnetic longitudinal bias layer.

9. The sensor element of claim 8 wherein the first seed layer for the spin-valve GMR sensor element is a layer of material chosen from the group consisting of NiCr and NiFeCr, and is formed to a thickness of between 15 Angstroms and 200 Angstroms.

10. The sensor element of claim 8 wherein the first seed layer for the spin-valve GMR sensor element is a layer of Ta, and is formed to a thickness of between 15 Angstroms and 200 Angstroms.

11. The sensor element of claim 9 wherein the lattice matching second seed layer for the hard magnetic longitudinal bias layer comprises a layer of CrX, X being chosen from the group consisting of Ti, W, Mo, V, and Mn, formed on a Ta underlayer, the Ta being formed to a thickness of between 10 Angstroms and 200 Angstroms, and the CrX being formed to a thickness of between 15 Angstroms and 200 Angstroms.

12. The sensor element of claim 10 wherein the lattice matching second seed layer for the hard magnetic longitudinal bias layer is a layer of CrX, X being chosen from the group consisting of Ti, W, Mo, V, and Mn and the CrX being formed to a thickness of between 15 Angstroms and 200 Angstroms.

13. The sensor element of claim 8 wherein the hard magnetic longitudinal bias layer is a layer of CoY, wherein Y is chosen from the group consisting of CrPt, Pt, and CrTa alloy, and is formed to a thickness of between 50 Angstroms and 1000 Angstroms.

14. The sensor element of claim 8 wherein the conducting lead layer is a layer of Ta/Au/Ta and is formed to a thickness of between 100 Angstroms and 1650 Angstroms.

* * * * *